US005374870A

United States Patent [19]

Akhekyan et al.

[11] Patent Number: 5,374,870

[45] Date of Patent: Dec. 20, 1994

[54] LASER SCREEN CATHODE-RAY TUBE WITH INCREASED LIFE SPAN

[75] Inventors: Arterm M. Akhekyan, Lvov, Ukraine; Vladimir I. Kozlovsky, Moscow, U.S.S.R.; Alexander S. Nasibov, Moscow, U.S.S.R.; Mikhail N. Sypchenko, Moscow, U.S.S.R.; Ivan A. Krykanov, Moscow, U.S.S.R.

[73] Assignees: Principia Optics, Inc., Los Angeles, Calif.; P.N. Lebedev Institute of Physics, Moscow, U.S.S.R.

[21] Appl. No.: 902,017

[22] Filed: Jun. 22, 1992

[51] Int. Cl.[5] ...................... H01J 29/10; H01L 21/302

[52] U.S. Cl. .................................... 313/463; 313/474; 148/DIG. 12; 437/225

[58] Field of Search .................. 313/463, 474; 372/36, 372/34; 437/225; 156/272.8, 610; 148/DIG. 12, DIG. 135; 501/65, 66

[56] References Cited

U.S. PATENT DOCUMENTS

| | | | |
|---|---|---|---|
| 4,695,332 | 9/1987 | Gordon et al. | 156/610 |
| 5,008,151 | 4/1991 | Tominaga et al. | |
| 5,250,460 | 10/1993 | Yamagata | 148/DIG. 12 |
| 5,254,502 | 10/1993 | Kozlovsky | 148/DIG. 12 |

*Primary Examiner*—Donald J. Yusko
*Assistant Examiner*—Vip Patel
*Attorney, Agent, or Firm*—Marshall A. Lerner

[57] ABSTRACT

A semiconductor laser screen in a cathode-ray tube with a sealed casing. The laser screen has a screen structure which is formed by a semiconductor member, a reflecting mirror and a partly transparent mirror on opposite sides of the semiconductor member. The screen structure is connected to a transparent support by means of a connecting layer which is formed by glass having a softening point of at least 675K. The materials of the semiconductor member, the transparent support, the connecting layer and the casing are made of materials with similarly low coefficients of expansion to prevent damage to the screen as it cools down from the manufacturing process.

4 Claims, 4 Drawing Sheets

LASER SCREEN CATHODE-RAY TUBE WITH INCREASED LIFE SPAN

FIELD OF THE INVENTION

The invention relates to electronic equipment and, in particular, to high-brightness kinescopes. More particularly, the invention deals with a cathode-ray tube and a method for making a laser screen for a cathode-ray tube which may be used in projection TV systems and in which laser radiation is generated at any point of a laser screen upon which an electron beam is incident.

BACKGROUND OF THE INVENTION

A prior art cathode-ray tube comprises a casing accommodating an electron optic system, a built-in getter pump and a laser screen having a semiconductor member which has mirror layers of both sides and a transparent heat removing support. The laser screen is mounted in the casing by means of an iron, cobalt and nickel alloy ring (Ulasyuk, V. N. Kvantoskopy [Laser Screen Cathode-Ray Tubes] (in Russian). Moscow. "Radio i Svyaz" Publishing House. 1988. p. 105). This is a sealed-off tube in which the laser screen has a cementing layer connecting the semiconductor member to the heat removing support. The cementing layer is formed when the semiconductor member is cemented to the support by means of an adhesive composition. Adhesive compositions which are generally used for this purpose cannot be heated above 150° C. Heat treatment and evacuation of the tube are carried out with cooling of the laser screen. The iron, cobalt and nickel alloy ring is designed for a thermal decoupling of the evacuated casing and laser screen when they are coupled together and during the heat treatment and evacuation.

The iron, cobalt and nickel alloy ring also ensures mechanical strength of the cathode-ray tube in case of a difference between temperatures of the casing and laser screen. The getter pump is used for evacuating gases released during storage and operation of the cathode-ray tube. These gases are released from the laser screen which cannot be subjected to a complete heat treatment in vacuum at a temperature above 400° C. because the cementing layer is decomposed at a temperature in excess of 150° C. The use of the getter pump and iron, cobalt and nickel alloy ring complicate manufacture of the cathode-ray tube. It is difficult to install the laser screen in the casing because the heat removing support, which is made of sapphire, should be metal plated and welded to the iron, cobalt and nickel alloy ring before installation. It should be noted that the getter pump cannot ensure complete removal of gases released during storage and operation of the cathode-ray tube because this pump is not highly efficient in pumping off aromatic hydrocarbons released by the cementing layer. The gases remaining in the casing substantially shorten life of porous metal cathodes generally used in such cathode-ray tubes. Low heat conductance and mechanical strength of the cementing layer also limit service life of the laser screen subjected to high temperature strains induced by electron beams in operation of the cathode-ray tube.

SUMMARY OF THE INVENTION

It is the main object of the invention to provide a laser screen cathode-ray tube wherein a connecting layer between a screen structure and a transparent support ensures evacuation of the tube at high temperature.

Another object of the invention is to provide a method for making a laser screen for a cathode-ray tube of the type described above.

Among other objects of the invention is to improve reliability of the cathode-ray tube.

Finally, it is an object of the invention to prolong service life of the cathode-ray tube.

These and other objects are accomplished in a cathode-ray tube with a laser screen which comprises a sealed evacuated casing having an interior space, a screen having a structure formed by a semiconductor member and mirror layers on opposite sides of the semiconductor member, and a support connected to the screen structure by means of a connecting layer, wherein, according to the invention, the connecting layer comprises a glass having a softening point of at least 675K.

With this construction of the cathode-ray tube the laser screen allows evacuation of the cathode-ray tube to be carried out at a high temperature so as to completely evacuate gases from the casing. This makes it unnecessary to have any means for evacuation of the casing during storage or in operation so that the manufacture and operation of the cathode-ray tube are greatly facilitated. It should be noted that complete evacuation of gases once and for all during manufacture of the cathode-ray tube substantially prolongs service life of the laser screen and cathode of the cathode-ray tube.

It should be noted that with a glass softening point below 675K it is not possible to ensure complete heat treatment and evacuation of the cathode-ray tube so that residual gases can shorten service life of the cathode-ray tube. Therefore this limitation is vital for accomplishing the main object of the invention.

A method for making a cathode-ray tube of the type described above comprises making the casing and the semiconductor member having two opposed sides, polishing one side of the semiconductor member, forming a first mirror layer on this side of the semiconductor member, and making a support. According to the invention this method comprises placing a glass having a softening point of at least 675K on the support. The semiconductor member having the first mirror layer is placed on the glass with the first mirror layer facing toward the glass. The glass is heated to a temperature above its softening point. The second side of the semiconductor member is then polished, and a second mirror layer is formed on the second polished side of the semiconductor member to form the screen structure. The screen structure is then mounted in the casing which is heated to a temperature of at least 675K or in any case to a temperature not exceeding the softening point of the glass, and the interior space of the casing is evacuated concurrently with the heating.

This method allows a connection between the semiconductor member and heat removing support to be made in such a manner as to allow the casing to be evacuated at a temperature which is high enough to ensure complete removal of gases from the interior space of the casing to prolong service life of the cathode-ray tube and to facilitate its manufacture as there is no need in carrying out evacuation every time after a prolonged storage or regularly during operation.

The limitation of the method which requires heating to a temperature of the softening point of the glass placed between the semiconductor member and the heat removing support is aimed at ensuring such temperature of the heat treatment of the internal components of the cathode-ray tube in a vacuum to achieve complete evacuation of gases so as to prolong service life of the cathode-ray tube.

In another embodiment of the method, a glass plate is prepared and is placed on the support, a force is applied to the glass plate, and the glass plate is heated to a temperature above the softening point. The glass plate is cooled and polished to a thickness of 10 μm to 3 mm, the semiconductor member is placed on the glass plate, and a force is applied to the semiconductor member. The glass is again heated to a temperature above the softening point. A bond is thus formed between the connecting layer and the screen structure. For the rest, this embodiment does not differ from that described above. In this case the use of a glass plate and the steps of this embodiment allow a perfect structure of the connecting layer to be produced since no pores nor voids can be formed. Reliability of the laser screen is enhanced and service life is prolonged.

It is very important that expansion coefficients of the semiconductor member, support, connecting layer and casing be matched. If not strong elastic stresses may appear inside the laser screen with the stresses worsening the properties of the laser screen and even resulting in a destruction of the laser screen after its cooling from temperatures of mounting the support in the casing or the softening point of the glass in the connecting layer to the working temperature of the screen. For this reason at first it is necessary to match expansion coefficients of the support and the semiconductor member and then to choose glass of connecting layer and casing, having matched expansion coefficients and necessary softening points. It is well known that glass being a multi-component material may be prepared such that the glass has practically any expansion coefficients and softening points down to 400C. In a practical manner to measure expansion coefficients a test element is prepared and the length is measured without increasing its temperatures.

It is preferred that materials of the semiconductor member, the support, the connecting layer and the casing be chosen in such a manner that test elements made of these materials change its length with heating as follows:

$$0 \leqq \Delta L_{c.1.} \leqq L \cdot 10^{-3}$$

$$0 \leqq \Delta L_s \leqq L \cdot 10^{-3}$$

$$0 \leqq \Delta L_c \leqq L \cdot 10^{-3}$$

wherein

L—is the length of test elements at $T_w$;

$\Delta L_{c.1.}$—is the change of L of the test element made of the material of the connecting layer with respect to L of the test element made of the material of the support after heating test elements from $T_w$ to $T_{c.1.}$;

$\Delta L_s$—is the alteration of L of the test element made of the material of the semiconductor member with respect to L of the test element made of the material of the support after heating test elements from $T_w$ to $T_{c.1.}$;

$\Delta L_c$—is the alteration of L of the test element made of the material of the casing with respect to L of the test element made of the material of the support after heating test elements from $T_w$ to $T_m$;

$T_w$—is the working temperature of the screen;

$T_{c.1.}$—is the softening point of the glass in the connecting layer;

$T_m$—is the temperature at which the screen support is mounted in the casing.

It is more preferable that the additional condition is valid:

$$\Delta L_{c.1.} \approx \leqq \Delta L_s$$

Moreover, the elastic stresses inside the semiconductor member will be minimum if $\Delta L_{c.1.} \approx L_s$. In this case the elastic stresses appearing inside the laser screen weaken the laser screen. This weakining may be decreased by increasing the thickness of the connecting layer. However, it is inadvisable to increase the connecting-layer thickness to more than 3 mm to avoid increasing the terminal resistance. On the other hand the connecting-layer thickness is preferred to be more than 10 μm to avoid excessive elastic stresses inside the semiconductor member.

The support is usually made of single-crystal sapphire having high heat-conductivity. For some purposes, such as a device with small average output light power, a laser screen may have a glass support of about 3 mm in thickness. In this case a laser screen may not have a connecting layer. The semiconductor member is connected to the glass support directly. Glass of this type of support has a softening point of at least 675K.

In a method for making a cathode-ray tube with the laser screen having a glass support and not having a connecting layer, a semiconductor member having the first mirror layer is placed on the glass support, a force is applied to the semiconductor member, and the glass plate is heated to a temperature above the softening point. For the rest, this embodiment does not differ from that described above.

Therefore, the above-described choice of the materials of the semiconductor member, the support, the connecting layer and the casing enhances reliability of the laser screen and further prolongs service life of the cathode-ray tube. It should be also noted that the above choices allows a cathode-ray tube to be assembled without an iron, cobalt and nickel alloy ring placed between the laser screen and the casing without any reduction of mechanical strength of a joint between the laser screen and casing which may be caused by substantial thermally induced elastic stresses in the casing and laser screen during heat treatment of the cathode-ray tube and in operation. Therefore, an intermediate member such as an iron, cobalt and nickel alloy ring, which is generally placed between the laser screen and the casing to compensate for a difference between expansion coefficients of the laser screen and casing can be dispensed with.

The upper limit of the variation of the length of the test elements set at $L \cdot 10^{-3}$ stems from the fact that a relative elongation of the semiconductor member, support, connecting layer, and casing caused by differences between the working temperature of the laser screen, temperature of manufacture of the laser screen, and temperature at which the laser screen is mounted in the casing should be below a value of $10^{-3}$ at which mechanical strength of solids substantially decreases (this value is close to a relative elongation at ultimate strength). This relative elongation $\Delta L/L$ is proportional to $\Delta\alpha \cdot \Delta T$, wherein $\Delta\alpha$ is a difference of expansion coefficients of the test elements. So if $T_w = (-200 \text{ to } +30)°$ C. and $T_{c.1}\approx 600°$ C., i.e. $\Delta T\approx 600$ to 800K, that the condition $\Delta L/L\approx 10^{-3}$ can result in $\Delta\alpha < 10^{-6}K^{-1}$. Thus the difference of expansion coefficients of the support and the connecting layer or the connecting layer and the semiconductor member or the support and the casing must not exceed $10^{-6}$K.

DESCRIPTION OF THE DRAWINGS

The invention will now be described with reference to specific embodiments shown in the accompanying drawings, in which.

Figure 1:
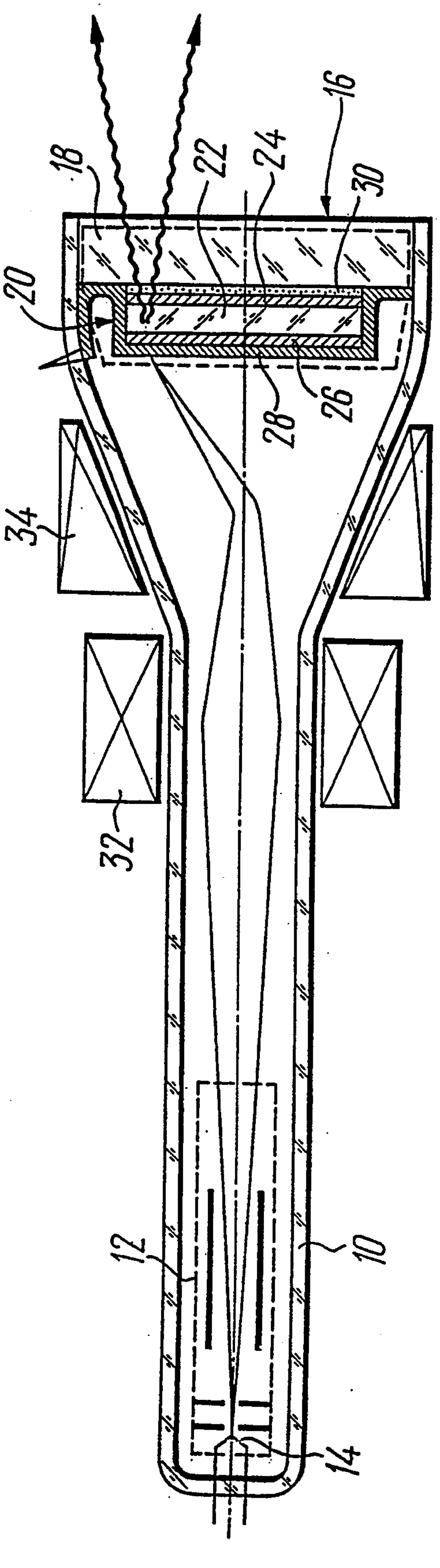
FIG. 1 schematically shows a general view, in longitudinal section, of a cathode-ray tube according to the invention.
Figure 2A:
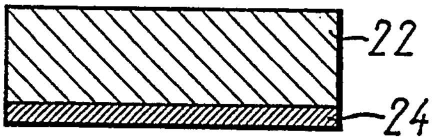
Figure 2B:
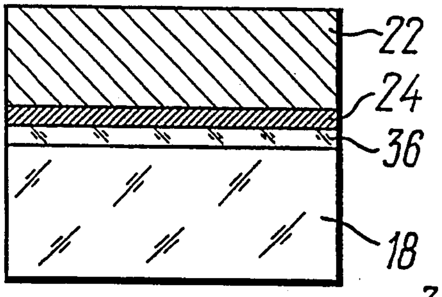
Figure 2C:
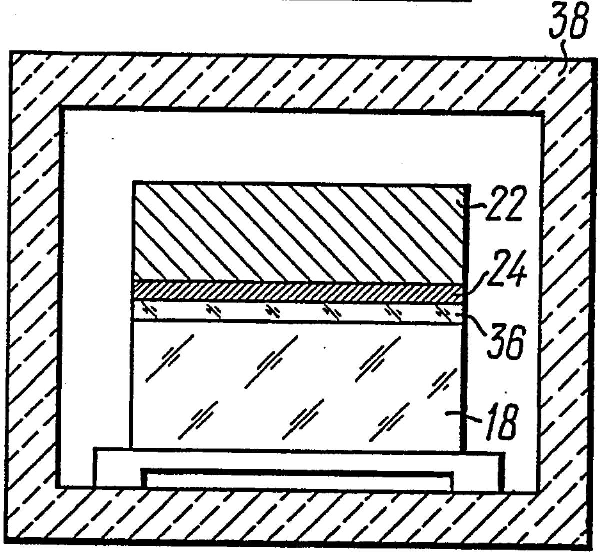
Figure 2D:
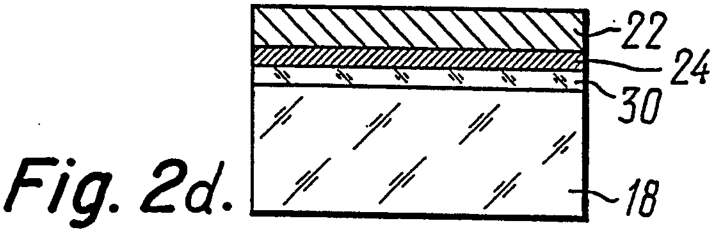
Figure 2E:
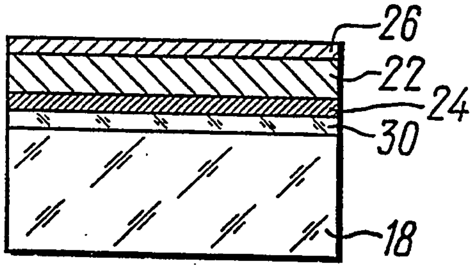
Figure 3A:
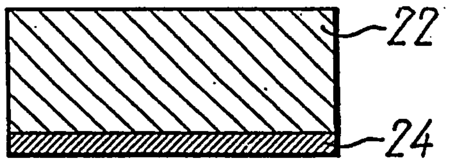
Figure 3B:
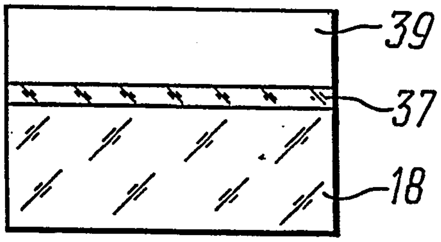
Figure 3C:
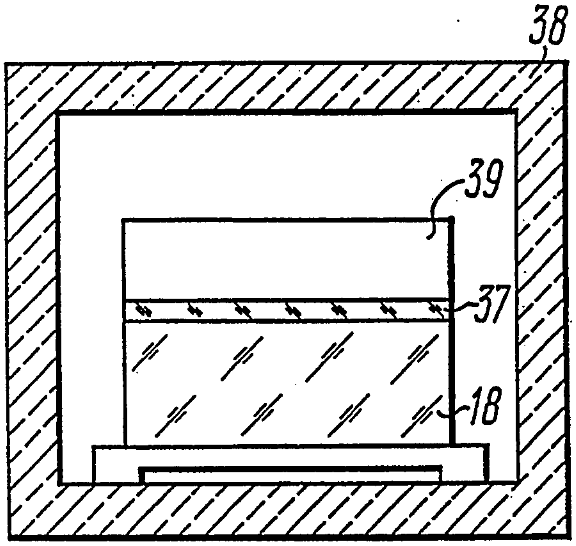
Figure 3D:
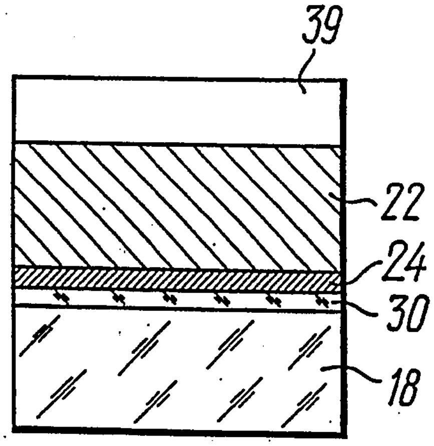
Figure 3E:
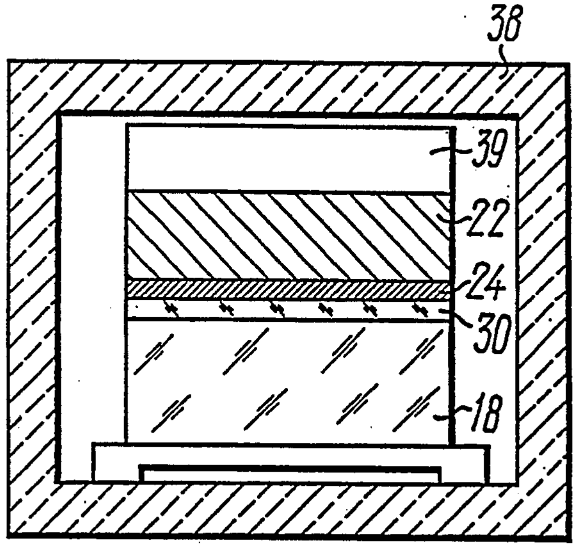
Figure 3F:
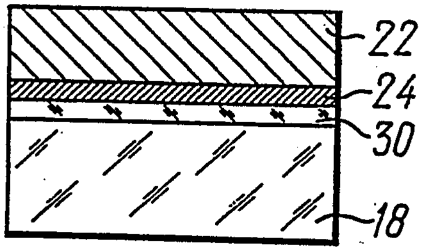
Figure 3G:
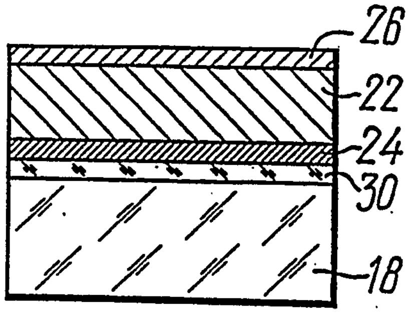
Figure 4A:
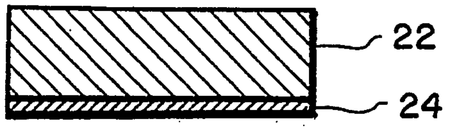
Figure 4B:
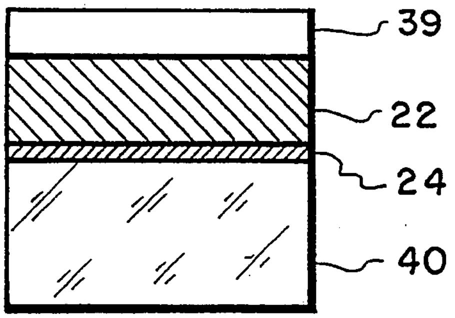
Figure 4C:
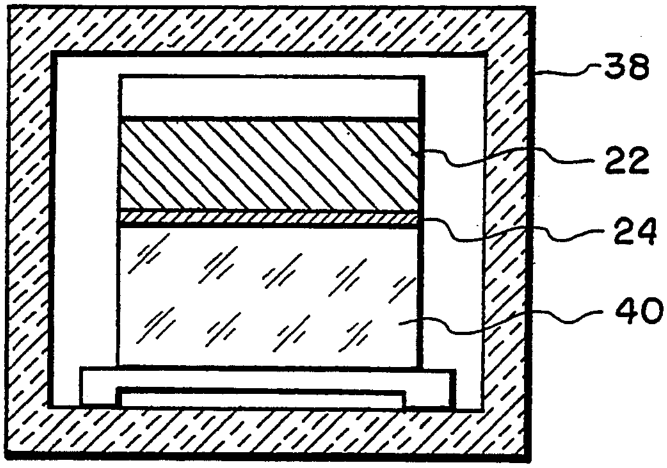
Figure 4D:
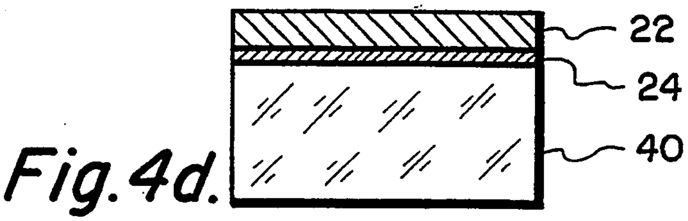
Figure 4E:
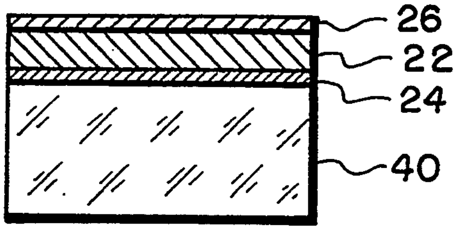

FIGS. *2a–2e* illustrate steps of a method for making a cathode-ray tube according to the invention of the type shown in FIG. 1;

FIGS. *3a–3g* illustrate steps of another embodiment of a method for making a cathode tube according to the invention of the type shown in FIG. 1.

FIGS. *4a–4e* illustrate steps of another embodiment of a method for making a cathode tube according to the invention of the type shown in FIG. 1 but having a laser screen with glass support.

DESCRIPTION OF PREFERRED EMBODIMENTS

With reference to FIG. 1, a cathode-ray tube has a casing 10 which is generally made of glass. Casing 10 accommodates an electron optic system generally shown at 12 and a cathode generally shown at 14. A laser screen generally shown at 16 is mounted in casing 10, at the end thereof opposite to that in which cathode 14 is installed. Laser screen 16 has a support 18 made of a transparent and heat conducting material, e.g., of sapphire and a screen structure 20. Screen structure 20 comprises a semiconductor member 22, which is generally in the form of a single-crystal wafer adapted for emitting laser radiation when excited with an electron beam generated by cathode 14, a partly transparent mirror 24 applied to one side of semiconductor member 22, and a reflecting mirror 26 formed on the opposite side of semiconductor member 22. An electrically conducting layer 28 is applied to reflecting mirror 26. The reflecting mirror and the partly transparent mirror define an optical cavity. It should be noted that if the reflecting mirror is made of an electrically conducting material, e.g., of a metal, electrically conducting layer 28 may not be applied. Screen structure 20 is attached to support 18 by means of a connecting layer 30 which forms an integral unit consisting of the screen structure and support. According to the invention this connecting layer 30 is made of a glass having a softening point of at least 675K. As mentioned above the support 18 may be made of glass plate of about 1 mm in thickness. In this case glass of support 18 has a softening point of at least 675K and the laser screen 16 does not have a connecting layer.

According to the invention, materials of semiconductor member 22, support 18, connecting layer 30, and casing 10 are chosen such that the test elements made from these materials change their length with heating as follows:

$$0\leqq\Delta L_{c.1.}\leqq L\cdot 10^{-3}$$

$$0\leqq\Delta L_{s}\leqq L\cdot 10^{-3}$$

$$0\leqq\Delta L_{c}\leqq L\cdot 10^{-3}$$

wherein

L—is the length of test elements at $T_w$;

$\Delta L_{c.1.}$—is the alteration of L of the test element made of the material of the connecting layer 30 with respect to L of the test element made of the material of the support 18 after heating test elements from $T_w$ to $T_{c.1.}$;

$\Delta L_S$—is the alteration of L of the test element made of the material of the semiconductor member 22 with respect to L of the test element made of the material of the support 18 after heating test elements from $T_w$ to $T_{c.1.}$;

$\Delta L_C$—is the alteration of L of the test element made of the material of the casing 10 with respect to L of the test element made of the material of the support 18 after heating test elements from $T_w$ to $T_m$;

$T_W$—is the working temperature of the screen 16;

$T_{c.1.}$—is the softening point of the glass in the connecting layer 30;

$T_m$—is the temperature at which the screen support 18 is mounted in the casing 10.

As mentioned the above-given limitation for choice of materials for the semiconductor member, connecting layer and support limit elastic stresses in the laser screen.

If $\Delta L_{c.1.}=L_S$, that elastic stresses appearing in the laser screen 16 are located for the most part outside semiconductor member 22 especially for the connecting layer 30 having large thickness. The connecting layer thickness ranges from 0.01 to about 3 mm.

As shown in FIG. 1, the cathode ray has an external focusing system 32 and an external deflecting system 34 in addition to electron optic system 12 provided in the interior space of casing 10.

The above-described cathode-ray tube is made in the following manner which will be described with reference to FIGS. 2,3 and 4 in which identical parts and components of the cathode-ray tube identical to those, which are illustrated in FIG. 1, are shown at the same reference numerals.

With reference to FIG. 2(*a*) partly transparent mirror 24 is formed on one side of semiconductor member 22 which is polished before application of the partly transparent mirror. The procedure of application of the partly transparent mirror does not have material bearing on this invention and is well known to those skilled in the art. As shown in FIG. 2(*b*), glass, e.g., in the form of glass powder or fine granules, is placed on support 18 to form a glass layer 36, and semiconductor member 22 is placed on this glass layer 36 with its partly transparent mirror 24 facing toward this layer 36. The support, glass layer and semiconductor member are then placed into a heating chamber 38 (FIG. 2(*c*)), and the glass layer is heated to a temperature above its softening point which is at least 675K. As a result, connecting glass layer 30 is then formed between partly transparent mirror 24 and support 18 as shown in FIG. 2(*d*). The glass layer may be heated in any other appropriate known manner, e.g., by radiation heat or otherwise, and the heating procedure does not have material bearing on the invention.

It should be noted that to produce a connecting glass layer without pores or voids, it is preferred that the heating chamber 38 is evacuated during heating of glass layer 36. Moreover an additional weight may be placed on semiconductor member 22 like another embodiment (described below).

As shown in FIG. 2(*e*), reflecting mirror 26 is formed on the opposite side of semiconductor member 22 after polishing it. As a result, a reliable bond is formed between partly transparent mirror 24 and support 18 so as to form screen structure 20 of FIG. 1. Casing 10 is made, and screen structure 20 is mounted in casing 10. Support 18 is welded to the inner wall of casing 10 in a known manner. It should be noted that the screen can also be mounted in the casing by means of a cement, e.g., with the aid of devitrified glass having a suitable expansion coefficient to comply with the conditions described above. In any case the screen structure and the casing should be heated in such a manner that the connecting glass layer between the support and the semiconductor member should not be heated above the softening point of the glass. Cathode 14, electron optic system 12 and eventually other components which should be disposed inside casing 10 are installed before or after the screen structure is mounted in casing 10. The interior space of casing 10 is then evacuated under heating. It should be noted that heating before and/or during evacuation of casing 10 is carried out to at least 675K and at any rate to a temperature which does not exceed the softening point of glass connecting layer 30. The temperature of 675K is the lowest temperature at which heating should be carried out. On the other hand, it is understood that heating to this temperature ensures removal of all gases from the interior space of casing 10. It will be apparent that heating above the softening point is not possible because it can result in the bond between support 18 and screen structure 20 becoming loose.

With reference to FIG. 3(*a*) partly transparent mirror 24 is formed on one side of semiconductor member 22 which is polished before application of the partly transparent mirror. The procedure of application of the partly transparent mirror does not have material bearing on this invention and is well known to those skilled in the art. As shown in FIG. 3(*b*), a glass plate 37 of an appropriate thickness (of about 1 mm) is placed on one side of support 18, and a force is applied to glass plate 37, e.g., by placing a weight 39 on it as shown in the drawing. It is preferred that the weight 39 is chosen to create a pressure on semiconductor member 22 of 0.5 to 2 kg per sq. cm. As shown in FIG. 3(*c*), the unit shown in FIG. 3(*b*) is placed into heating chamber 38 in which glass plate 37 is heated to a temperature above the softening point. The heating chamber 38 may be evacuated. This results in the glass plate material 37 softening which ensures a reliable bond between the glass and support. The glass plate may be heated in any other appropriate known manner, e.g., by radiation heat or otherwise, and the procedure of heating does not have material bearing on the invention. The glass plate 37 is then cooled and its top side is polished to form a glass connecting layer 30 having the desired thickness as shown in FIG. 3(*d*). Semiconductor member 22 with partly transparent mirror 24 and weight 39 are then placed on glass layer 30 as shown in FIG. 3(*d*). This unit is again placed into heating chamber 38 as shown in FIG. 3(*e*), and glass layer 30 is again heated to a temperature above its softening point to form a bond with partly transparent mirror 24. Further steps of manufacture of the cathode-ray tube according to the invention are similar to those described above with reference to FIG. 2 and are illustrated in FIGS. 3(*f* and *g*). It should be noted that when semiconductor member 22 is placed with its partly transparent mirror 24 on the polished side of glass plate 30, weight 39 is placed on top of semiconductor member 22 or a force is otherwise applied to the semiconductor member before heating the glass plate.

With reference to FIG. 4(*a*) partly transparent mirror 24 is formed on one side of semiconductor member 22 which is polished before application of the partly transparent mirror. As shown in FIG. 4(*b*) a semiconductor member 22 with partly transparent mirror 24 is placed on one side of glass support 40 of about 3 mm. in thickness and having a softening point of at least 675K and weight 39 is placed on semiconductor member 22. As shown in FIG. 4(*c*), the unit shown in FIG. 4(*b*) is placed into heating chamber 38 in which glass support 40 is heated to a temperature above the softening point. The heating chamber 38 may be evacuated or be filled with inert gas. This results in the glass support material being softened and this insures a reliable bond between the glass support 40 and partly transparent mirror 24. Further steps of manufacture of the cathode-ray tube according to the invention are similar to those described above with reference to FIG. 2, FIG. 3 and are illustrated in FIG. 4(*d* and *e*).

It is understood that the choice of materials for the casing, semiconductor member, support and connecting layer are chosen for embodiments of the method according to the invention as described above.

The invention will now be illustrated with reference to concrete non-limiting examples of practical implementation of the method according to the invention.

EXAMPLE 1

A casing for a laser screen was made of glass S-52 (Russian name) having $5.2 \cdot 10^{-6}K^{-1}$ of an expansion coefficient in temperature range from 300 to 600K, the length alteration of the test glass element of 50 mm in length with increasing temperature from 300 to 700K was 104 μm.

The inside diameter of one end of the casing was 60 mm. A semiconductor member in the form of a single-crystal CdS wafer of 50 mm in diameter was oriented along plane (0001). The length alteration of the test semiconductor-member element of 50 mm in length along plane (0001) with increasing temperature from 300 to 700K was 100 μm. One side of the wafer was chemically and mechanically polished. An eleven-layer coating of alternating layers of $ZrO_2$ and $Al_2O_3$ was formed on a polished side of the wafer. A plane parallel sapphire support with orientation (0001) 60 mm in diameter and 10 mm thick was made. The length alteration of the test sapphire-support element of 50 mm in length along plane (0001) with increasing temperature from 300 to 700K was 120 μm. A layer of about 100 μm of a glass powder with a grain size of 20 μm was placed on one side of the support. The glass powder was made of glass S-52 (Russian name) and had a softening point slightly above 675K. The semiconductor member was placed on the glass layer with the deposited layer facing towards the glass layer. The unit consisting of the semiconductor member with mirror, the glass layer and the support was placed inside evacuated cavity of electrical furnace, was heated to 750K and was allowed to stay there for two hours until a glass connecting layer 30 μm thick was formed. The other side of the semiconductor member was chemically and mechanically polished to a thickness of the semiconductor member of 20 μm. A silver coating of 0.1 μm was deposited on this polished side of the semiconductor member. The resulting laser screen was cemented at 675K to the end of the casing along the perimeter of the sapphire support with the aid of a devitrified glass cement having an expansion coefficient of $5.2\cdot10^{-6}K^{-1}$. Other systems of the cathode-ray tube were placed in the casing, and the cathode-ray tube was heat treated in vacuum at 675K for two hours and was then sealed off.

The resulting cathode-ray tube had a service life which was at least 1.5 times as long as the service life of conventional laser screen cathode-ray tubes with a simpler structure (absence of a getter pump and special ring between the screen and casing). An evaluation of service life was made from an experiment in which a television picture was compressed 20 times along a direction of vertical sweeping and a time of falling of output light power up to 80% of former value was measured under controlling an average temperature of the laser screen at nearly room temperature. This time was multiplied by a factor of 20 for evaluation of service life. In operation with water cooling and with an electron beam having an energy of electrons of 75 keV, current density of 200 A/sq. cm and scanning speed of $2.10^5$ cm/s, the cathode-ray tube with this laser screen had a lasing efficiency of at least 0.04 at a lasing wavelength of 525 nm.

EXAMPLE 2

A laser screen for a cathode-ray tube was made as described in Example 1, but glass for making a connecting layer was in the form of a glass plate 1.5 mm thick made of glass S-52 (Russia name) and had a softening point of 900K. The length alteration of the test glass element of 50 mm in length with increasing temperature from 300 to 900K was 156 μm., while the length alteration of the test semiconductor-member element of 50 mm in length under the same conditions was 165 μm and the length alteration of the test support element of 50 mm in length under the same conditions was 180 μm. The glass plate was placed on the sapphire support. A weight for applying a pressure of about 1 kg per sq. cm of the plate was placed on the plate, and the support with the plate and weight were placed in an electric furnace for heating to about 1000K with a subsequent cure during one hour. The whole unit was then cooled, and the glass plate connected to the support was polished to a thickness of the glass layer of 40 μm to obtain a connecting layer. The wafer was then placed on this connecting layer, and the same weight was placed on the wafer. The whole unit was again placed into an electric furnace and allowed to stay at 1000K during one hour to form a bond between the connecting layer and the wafer and to obtain a connecting layer 30 μm thick. The resulting laser screen was mounted in the casing by welding of the support and the casing which were preheated to 850K. The welding was carried out by means of a $CO_2$ laser with a local heating to 950–980K. The cathode-ray tube was heat treated at 820K during two hours.

The resulting cathode-ray tube had a service life which was at least 1.5 times as long as the service life of conventional laser screen cathode-ray tubes with a simpler structure (absence of a getter pump and special ring between the screen and casing). In operation with water cooling and with an electron beam having an energy of electrons of 75 keV, current density of 200 A/sq. cm and scanning speed of $2\cdot10^5$ cm/s, the cathode-ray tube with this laser screen had a lasing efficiency of at least 0.05 at a lasing wavelength of 525 nm.

EXAMPLE 3

A casing of 40 mm in inside diameter and a semiconductor member with partly transparent mirror of 30 mm in diameter were made as described in example 2, but a support was made of glass S-52 (Russia name) having a softening point like a casing glass of 900K and had 3 mm in a thickness. The semiconductor member was placed on the glass support with the mirror facing toward the glass support. Then a weight for applying a pressure of about 1 kg. per square cm. was placed on the semiconductor member. This unit was heated in an electric furnace to about 1000K with a subsequent cure of one hour.

The other side of the semiconductor member was chemically and mechanically polished to a thickness of the semiconductor member of 20 μm. A silver coating of 0.1 μm. was deposited on this polished side of the semiconductor member. The resulting laser screen was welded into the casing as described in example 2.

The cathode-ray tube had the same advantages as that described in Example 2 but an average of output light power was not more than 0.5 W.

Non-limiting explanatory embodiments of the invention have been described above. It is understood that various modifications and supplements may be made by those skilled in the art which do not go beyond the spirit and scope of the invention as defined in the attached claims.

We claim:

1. A cathode-ray tube with a semiconductor laser screen comprising:

a sealed casing having an interior space;

a laser screen in said casing, said laser screen comprising a screen structure formed by a semiconductor member, a reflecting mirror layer and a partly transparent mirror layer on opposite sides of said semiconductor member, and a transparent support attached to said screen structure;

a connecting layer comprising a glass having a softening point of at least 675K, said connecting layer being positioned between one of said mirror layers and said transparent support, whereby said transparent support is attached to said screen structure; and, wherein materials of said semiconductor member, said transparent support, said connecting layer and said casing are chosen in such a manner that test elements made of these materials change their lengths with heating as follows:

| |
|---|
| $O \leqq \Delta L_{c.1.} \leqq L: 10^{-3}$ |
| $O \leqq \Delta L_{c.1.} \leqq L: 10^{-3}$ |
| $O \leqq \Delta L_{c} \leqq L: 10^{-3}$ |

wherein

L—is the length of test elements at $T_w$;

$\Delta L_{c.1.}$—is the alteration of L of the test element made of the material of the connecting layer with respect to L of the test element made of the material of the transparent support after heating test elements from $T_w$ to $T_{c.1.}$;

$\Delta L_s$—is the alteration of L of the test element made of the material of the semiconductor member with respect to L of the test element made of the material of the transparent support after heating test elements from $T_w$ to $T_{c.1.}$;

$\Delta L_c$—is the alteration of L of the test element made of the material of the casing with respect to L of the test element made of the material of the transparent support after heating test elements from $T_w$ to $T_m$;

$T_w$—is the working temperature of the screen;

$T_{c.1.}$—is the softening point of the glass in the connecting layer;

$T_m$—is the temperature at which the transparent support is mounted in the casing.

2. The cathode-ray tube of claim 1, wherein $\Delta L_{c.1.} \leqq \Delta L_s$.

3. A cathode-ray tube with a semiconductor laser screen structure comprising:

a sealed casing having an interior space;

a laser screen in said casing, said laser screen comprising a screen structure formed by a semiconductor member, a reflecting mirror layer and a partly transparent mirror layer on opposite sides of said semiconductor member, and a transparent support attached to said screen structure;

a connecting layer comprising a glass having a softening point of at least 675K, said connecting layer being positioned between one of said mirror layers and said transparent support, whereby said transparent support is attached to said screen structure;

wherein said transparent support is made of glass having a softening point of at least 675K and said connecting layer is only part of said transparent support; and, wherein the materials of said semiconductor member, said transparent support and said casing are chosen in such a manner that the test elements made of these materials change their lengths with heating as follows:

$$O \leqq \Delta L_s \leqq L \cdot 10^{-3}$$
$$O \leqq \Delta L_c \leqq L \cdot 10^{-3}$$

wherein

L—is the length of test elements at $T_w$;

$\Delta L_s$—is the alteration of L of the test element made of the material of the semiconductor member with respect to L of the test element made of the material of the transparent support after heating test elements from $T_w$ to $T_{c.1.}$;

$\Delta L_c$—is the alteration of L of the test element made of the material of the casing with respect to L of the test element made of the material of the transparent support after heating test elements from $T_w$ to $T_m$;

$T_w$—is the working temperature of the screen;

$T_{c.1.}$—is the softening point of the glass in the connecting layer;

$T_m$—is the temperature at which the transparent support is mounted in the casing.

4. The cathode-ray tube of claim 3, wherein said support and said casing are made of the same glass, having a softening point of at least 675K.

* * * * *